United States Patent [19]

Shigematsu et al.

[11] Patent Number: 5,301,862
[45] Date of Patent: Apr. 12, 1994

[54] SOLDER COATING APPARATUS

[75] Inventors: Chiaki Shigematsu; Naokatsu Kojima, both of Shizuoka, Japan

[73] Assignee: Fuji Seiki Machine Works, Ltd., Shizuoka, Japan

[21] Appl. No.: 956,613

[22] Filed: Oct. 5, 1992

[30] Foreign Application Priority Data

Oct. 7, 1991 [JP] Japan .................. 3-285540

[51] Int. Cl.$^5$ .................. H01L 21/48; B05C 3/20; B05C 5/02
[52] U.S. Cl. .................. 228/43; 228/254; 228/258
[58] Field of Search .................. 228/254, 256, 258, 33, 228/36, 43; 118/428, 429, 504; 427/123

[56] References Cited

U.S. PATENT DOCUMENTS

| | | | |
|---|---|---|---|
| 4,807,794 | 2/1989 | Hess | 228/102 |
| 4,836,131 | 6/1989 | Kataoka | 118/220 |
| 4,858,554 | 8/1989 | Tsuchiya | 118/224 |
| 4,885,837 | 12/1989 | Eshima et al. | 29/564 |
| 4,920,074 | 4/1990 | Shimizu et al. | 29/856 |
| 4,987,100 | 1/1991 | McBride et al. | |
| 5,011,067 | 4/1991 | Foisy | 228/179 |
| 5,031,821 | 7/1991 | Kaneda et al. | 228/179 |
| 5,034,349 | 7/1991 | Landis | 29/837 |
| 5,057,337 | 10/1991 | Makino et al. | 118/227 |
| 5,199,990 | 4/1993 | Zeniya | 228/43 |
| 5,200,368 | 4/1993 | Kojima et al. | 228/179 |

FOREIGN PATENT DOCUMENTS 2-246107  10/1990  Japan .

Primary Examiner—Samuel M. Heinrich
Attorney, Agent, or Firm—Flynn, Thiel, Boutell & Tanis

[57] ABSTRACT

A solder coating apparatus for coating lead sections of a lead frame, including a liquid solder bath and a coating block having a first slit-like passage therethrough for permitting a lead frame to pass through the block and a second passage of enlarged cross section communicating with and extending along the first passage for permitting the lead frame package to pass through the block. A pair of liquid solder supply slits are formed in the block and communicates with the first passage along the length thereof and on opposite sides of the second passage. A pump at least partially immersed in the liquid solder bath provides for positive supply of liquid solder to and through the slits into the first passage to coat the lead sections. A conduit connects between the delivery side of the pump and the liquid solder supply slits.

4 Claims, 7 Drawing Sheets

SOLDER COATING APPARATUS

FIELD OF THE INVENTION

This invention relates to a solder coating apparatus, and particularly an apparatus for solder coating the leads of semi-conductor devices packaged on a lead frame.

BACKGROUND OF THE INVENTION

There are known methods for coating a lead section of a lead frame, on which a semi-conductor device is mounted and packaged within a synthetic resin, with a soft material such as solder material. One is an electro-solder plating method, and the other is a dipping or immersion method. Many variations of these processes have been proposed. Roughly speaking, in one variation the packages are cut off with the leads from the lead frame, and after making a single device, each side of the device is soaked or immersed in a liquid solder bath. In a second variation the lead section of the lead frame is soaked or immersed so as to be coated without cutting off the single device from the lead frame.

The Assignee of the present invention discloses in Laid-down Japanese Patent Application SHO 63-80963 and U.S. Pat. No. 4,836,131 a solder coating apparatus which coats the lead section of the lead frame, before cutting off each packaged device from the lead frame, by a pair of two coating rolls arranged in a vertical plane. However, in this apparatus, the number of pairs of coating rolls required corresponds to the number of packages on the lead frame. This can be undesirable.

The Assignee of this invention has also proposed a new solder coating method as shown in Laid-down Japanese Patent Application HEI 1-18077 and U.S. Pat. Nos. 4,858,554 and 5,057,337, in which two liquid solder baths cooperate with a pair of opposed coating rolls so that a lead frame can pass through between the opposing rolls, whereby the liquid solder material is coated on both sides of the lead frame passing through between the two rolls. A lower part of each roll is immersed in the liquid solder material and the rolls rotate in opposite directions to coat the lead frame as it is moved between the two rolls. However, in this method, movement of the lead frame must be vertical when said lead frame is coated with solder material. After it is coated, the lead frame must be moved horizontally. This requires an intricate transfer mechanism, and makes the overall apparatus more complex than desired.

Another coating method is to use the capillary phenomenon of liquid solder material. In this method, however, only a lower part of the lead frame can be coated with the solder material. It is difficult to simultaneously coat both sides (upper side and lower side) of the lead frame. As to such method, the Assignee has proposed a coating device in Japanese Patent Application Serial No. 1-251 989 and U.S. application Ser. No. 07/764 730 (now U.S. Pat. No. 5,200,368) in which a lead frame is pushed in and passes through the coating breech of a solder coating block so that a section of the lead frame contacts liquid solder which comes up through a slit from the bath and fills the passage of the lead frame.

The solder coating apparatus mentioned in the foregoing paragraph has desirable features in that the lead frame can be coated with solder film while the workpiece is transferred continuously in horizontal lay. The apparatus does not have moving parts except for the feed-in and take-out mechanisms of the workpieces, and the coating process itself is simple as is its structure.

But in this above-described method and structure, while the soldering operation proceeds continuously, nevertheless metal oxides, deteriorated flux and gross grow and gradually attach around the coating block and its passage. They grow to such extent that these contaminates cause defects in the coated film as the contaminates become mixed with the solder material flow and cause partial passage blockage and uneven film thickness. Thus, the solder bath and the solder coating block must be frequently cleaned to make soldering operation satisfactory.

In the present invention, a new solder coating apparatus is proposed in which liquid solder material at a bottom of the solder bath is forcibly supplied to each slit of the coating block in a constant amount to avoid adherence of the unusable materials.

In an attempt to attain the above, this invention provides a solder coating apparatus in such way that the coating block has a passage for the lead frame and a second passage for the package, and a liquid solder supply slit is cut along the lower two sides of the lead frame passage. A pump, the main body of which is immersed in the liquid solder bath, supplies liquid solder through a connecting pipe to the liquid solder supply slit.

Moreover, the solder coating apparatus is furnished with an intermediate solder reservoir which is installed under the solder supply slit, and is connected with the connecting pipe.

In performance of the invention, clear, melted solder material is always supplied by the pump to the lead frame passage through the solder material supply slit, and abundantly fills said passage; the lead section of the lead frame moves through the passage filled with liquid solder material, whereby both sides of the lead section are coated with solder. Molten solder material is returned and reserved in the solder reservoir, and is again sent to the lead frame passage through the solder material supply slit which is connected with the solder reservoir.

DETAILED DESCRIPTION

The present invention shall be explained by reference to the accompanying drawings.

Figure 1:
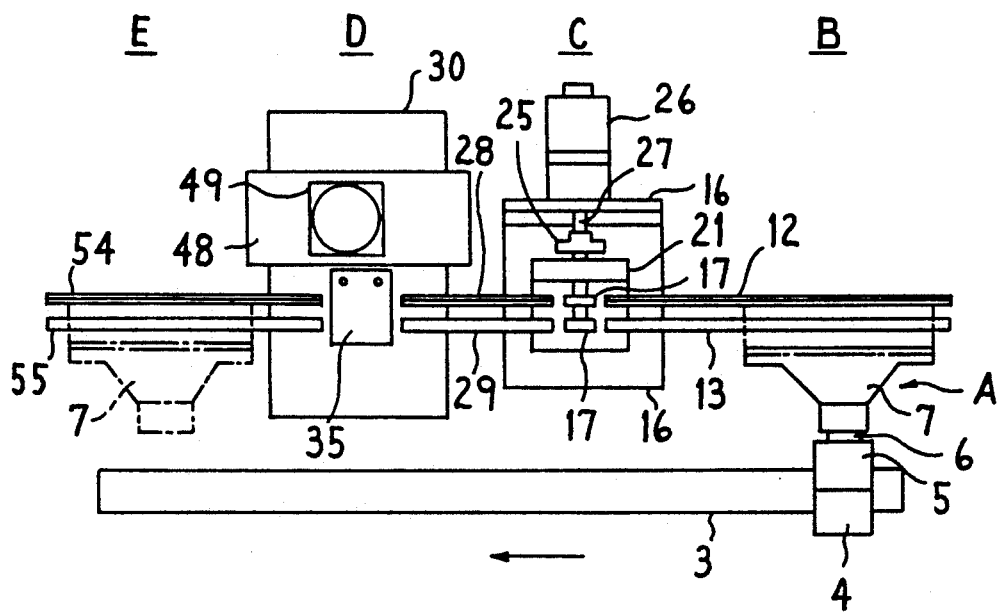
FIG. 1 is a plan view of a solder coating apparatus embodying this invention.

As shown in FIG. 1, the automatic solder coating apparatus comprises a lead frame transfer device A, a lead frame locating device B, a flux coating device C, a solder coating device D, and a carry-out device E.

Figure 3:
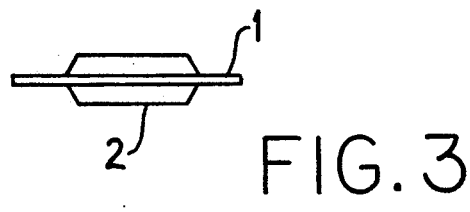
FIG. 3 is a side view of the lead frame.

The lead frame, as shown in FIG. 3, is a thin metal strip 1 One or more semi-conductor devices are mounted at the middle of the width of the lead frame in spaced relation longitudinally therealong. A package 2 encapsulates each semi-conductor device, and the lead sections of the device project out from opposite sides or from all four sides of the package 2. The lead section is stamped out with the same pattern from the metal strip 1.

Figure 2:
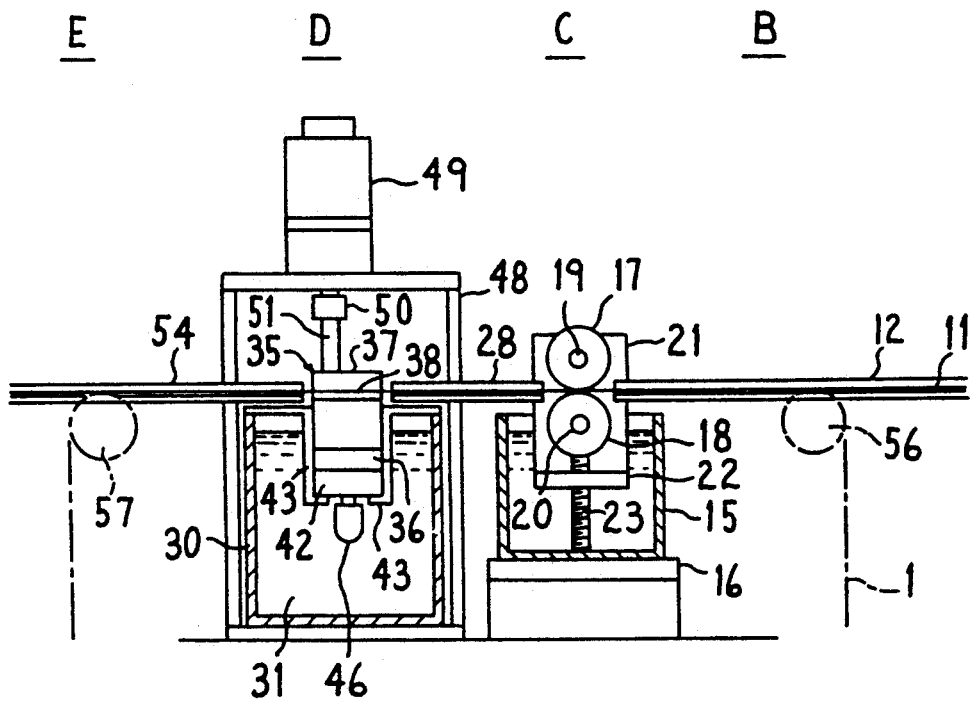
FIG. 2 is a vertical sectional view of said apparatus.
Figure 4:
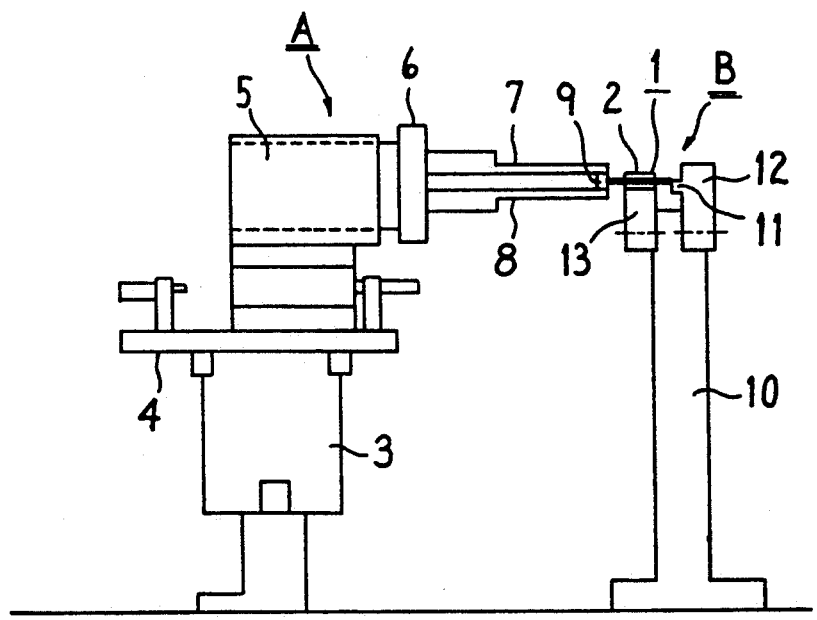
FIG. 4 is a side view of the lead frame transfer device and the lead frame locating device showing how they relate to each other.

The lead frame transfer device A, as shown in FIGS. 1, 2 and 4, includes a pressure cylinder 5 which is mounted on a base 4, which base 4 is slidably mounted on and movable along a stationary elongated guide rail 3 which extends from the locating device B to the carry-out device E. The cylinder 5 moves the lead frame 1 in a direction perpendicular to the longitudinal direction of the lead frame by the holding arm 6. Two cramping pieces 7 and 8 are mounted on the holding arm 6 and open and close in vertical direction. A pin 9 which is set on the cramping device 8 fits into a small hole which extends through the lead frame on one side thereof for holding the lead frame along one side thereof. The base 4 slides along the guide rail 3 by a conventional driving mechanism (not shown).

The locating device B, as shown in FIGS. 1, 2 and 4, includes a longitudinally elongate guideway 12 which is fixed on an upper end of the pillar 10 and which extends parallel to the guide rail 3. Guideway 12 defines an elongate support or guide plane 11 for slidably guiding one edge of the lead frame 1. The device B also includes an elongate package support rest or rail 13 which slidably supports the package 2 of the lead frame and is fixed in parallel with the guide rail 12.

By action of the cylinder 5, a lead frame is pushed against the guideway 12 and located. Then, pin 9 on the cramping piece fits into the hole of the lead frame to hold the lead frame in proper position.

Figure 5:
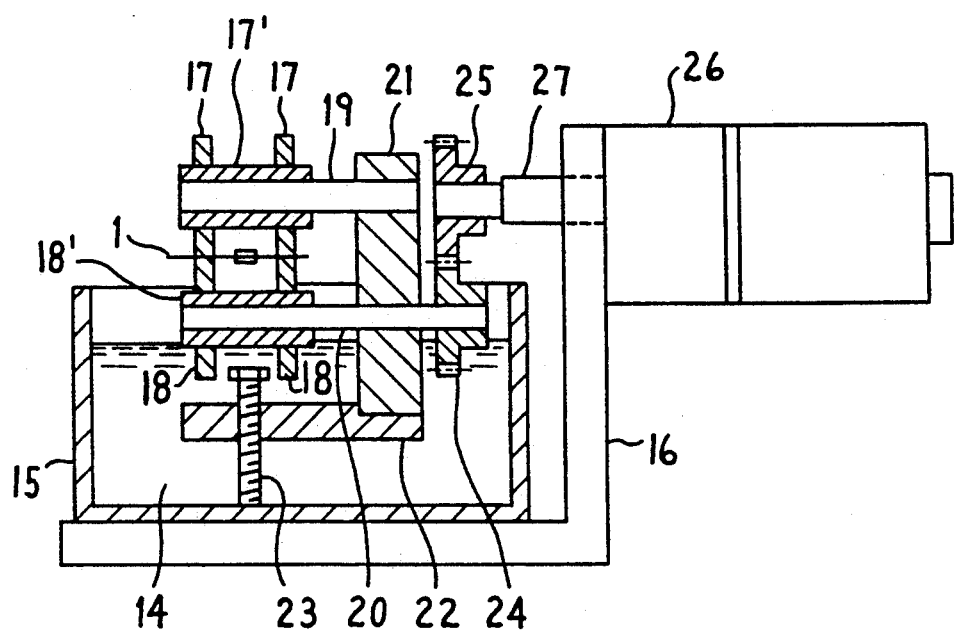
FIG. 5 is a side view of the flux coating device, a part of which is shown in cross section.

The flux coating device C, as shown in FIGS. 1, 2 and 5, includes an upwardly opening flux bath 15 mounted on a lower leg of an L-shaped frame 16 in such wa that said bath is located at the outlet end of rails 12 and 13. Pairs of upper and lower brush rolls 17-17 and 18-18 are equipped on the flux bath. The brush rolls 17 are mounted on a sleeve 17' adjacent opposite ends thereof, and the other brush rolls 18 are mounted on a sleeve 18' adjacent opposite ends thereof. The sleeves 17' and 18' are fixed on shafts 19 and 20, respectively. The brushes are sidewardly spaced to straddle the package 2 and hence contact the lead sections disposed on opposite sides of the package. A wall 21 rotatably supports said two shafts 19 and 20.

The supporting wall 21 is supported and fixed at its lower end on a base plate 22. Adjust screws 23 which fit on the base plate 22, support the plate 22 to permit adjustment in the height of the shaft 20. The shaft 20 penetrates the supporting wall 21, and a gear 24 is attached at an end of the shaft 20. A motor 60 is mounted on the vertical leg of frame 16. Motor shaft 27 has a driving gear 25 which mates with the gear 24 and drives the brushes.

The guide rail 28 and the package support rail 29, each of which is the same structure as the guide rail 12 and package support rail 13, are arranged so as to project in a downstream direction away from the flux bath. The rails 12-13 hence align with and feed the lead frame into the nip between brushes 17-18 and the rails 28-29 are aligned with the downstream side of the nip to feed the lead frame onto the solder coating device D.

The lead frame is transferred to the flux coating device B by the lead frame transfer device A. By driving motor 26, the lower two brushes 18, which are immersed in the flux fluid 14, rotate and coats the lower side of the lead frame with flux. The upper two roll brushes 17 which rotate jointly with the lower brushes 18, due to engagement with either the moving lead frame or the moving lower brushes, are also wet with flux and coat the upper side of the lead frame with flux 14 as the lead frame moves through the nip between the brushes.

Figure 6:
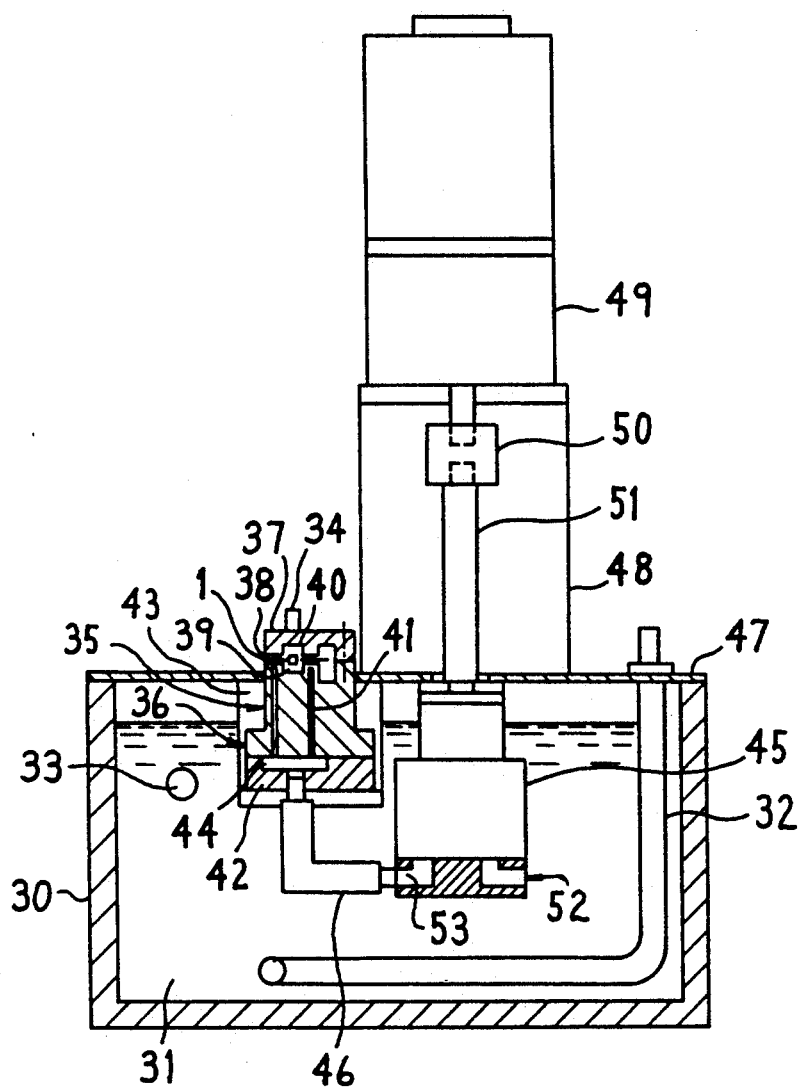
FIG. 6 is a front view of the solder coating device, a part of which is shown in cross section.

The solder coating device D, as shown in FIGS. 1, 2 and 6, includes a liquid solder bath 30 positioned adjacent but downstream of the flux bath 15. Molten solder material is reserved in this solder bath 30. A heating tube 32, a heat sensor 33 and an inert gas delivery tube 34 are arranged inside of said bath 30. A solder coating block 35 occupies a part of the inside of the bath 30 so that a lower section of the block 35 is immersed in liquid solder.

The coating block 35 comprises a lower block 36 and an upper block 37. Upper block 37 is connected with said lower block by a hinge so as to turn freely on the lower block if necessary, such as for maintenance purposes. A slit-like passage 38 is formed between the lower and upper blocks and extends horizontally through the block. The passage 38 is vertically thin to accommodate the lead frame 1, and one side edge of passage 38 opens sidewardly of the block so as to permit the lead frame to remain engaged with the holding arm 6.

The block 35 also has a further passage 39-40 extending horizontally therethrough, which passage is of generally rectangular cross section so as to be of greater height but narrower width than passage 38. The upper and lower portions of passage 39-40 communicate with a center part of passage 38 and project upwardly and downwardly therefrom to accommodate movement of the packages 2 therethrough. At both sides of the lower package passage 39, there are slits 41 which communicate with the passage 38 adjacent opposite sides of the package passage 39, which slits 41 communicate with passage 38 over much of the longitudinal length thereof. These slits 41 open downwardly through the lower block 36. A piping block 42 is fixed underneath the lower block 36. L-shaped brackets 43 (FIG. 2) support the piping block 42 from the upper edge of the solder bath 30.

Piping block 42 defines therein an interior solder reservoir 44 for communication with lower ends of slits 41. Reservoir 44 also connects with delivery outlet 46 of pump 45, as described below.

The pump 45 is a gear pump which, in this example, is made by Takachiho Machine Co. Ltd. and its designation is HDS - 25, 3 c.c./rev. The pump 45 is mounted on the cover 47 for the liquid solder bath 30, and the pump body is immersed in the liquid solder bath. The pump 45 is driven by a motor 49 coupled with the pump shaft 51 by a coupling 50. The motor 49 is supported by a channel-like bracket 48 which has legs adjacent opposite sides of the liquid solder bath for support thereon. By driving the pump 45, liquid solder material sucked from the inlet 52, is sent to the reservoir 44 via pump outlet 53 and supply tube 46. Liquid solder is then forcibly sent to the passage 38 through the slits 41 and coats the lead sections of the lead frame moving through the passage 38.

The carry-out or removal device E, as shown in FIG. 1, comprises a guideway or rail 54 and a package support rail 55 which project downstream away from the liquid solder bath 30 as an elongation of the rails 28 and 29 and are of generally the same construction.

In the embodiment of the invention described above, first the lead frame 1 is pushed sidewardly to abut the guideway 12 so as to be correctly located. Then the pin 9 fits into the small hole on a side portion of the lead frame. Next, the transfer device 4 moves longitudinally along the guideway rail 3 and causes the lead frame 1 to pass through the flux coating device C. When the lead frame passes through the nip between the upper and lower brush rolls 17 and 18, flux 14 is coated on both sides of the lead frame 1.

The transfer device 4 then moves the lead frame 1 into and through the passages 38, 39, 40 of the coating block 35. Clear liquid solder material from the lower portion of the liquid solder bath 30 is forcibly sent to the slits 41 and thence into the passage 38 by the pump 45. Both the upper and lower sides of the lead section of the lead frame are thus solder coated as the lead frame is moved longitudinally through the passage 38. After coating is completed, the lead frame is sent to a predetermined location by any conventional means, such as a mechanical hand.

In the above example, the slits 41 are described as formed in the lower coating block 36. However, the slit is not the only means to send liquid solder material to the passage 38. The slit can be replaced by numerous small holes or any other equivalent means. Use of the term "solder material supply slit" herein shall include such other means for use in accomplishing the same purpose.

In the above-mentioned example, one passage 39, 40 is provided in the coating block 35 to accommodate the package 2. This structure is usable when the lead frame moves along the line of its longitudinal direction. If the lead frame is to be moved along its crosswise direction, then multiple passages 39, 40 for the packages to pass through the coating block shall be necessary equal to the number of packages on the lead frame. As a matter of course, the solder supply slits shall be provided on both sides of each package passage.

Figure 7:
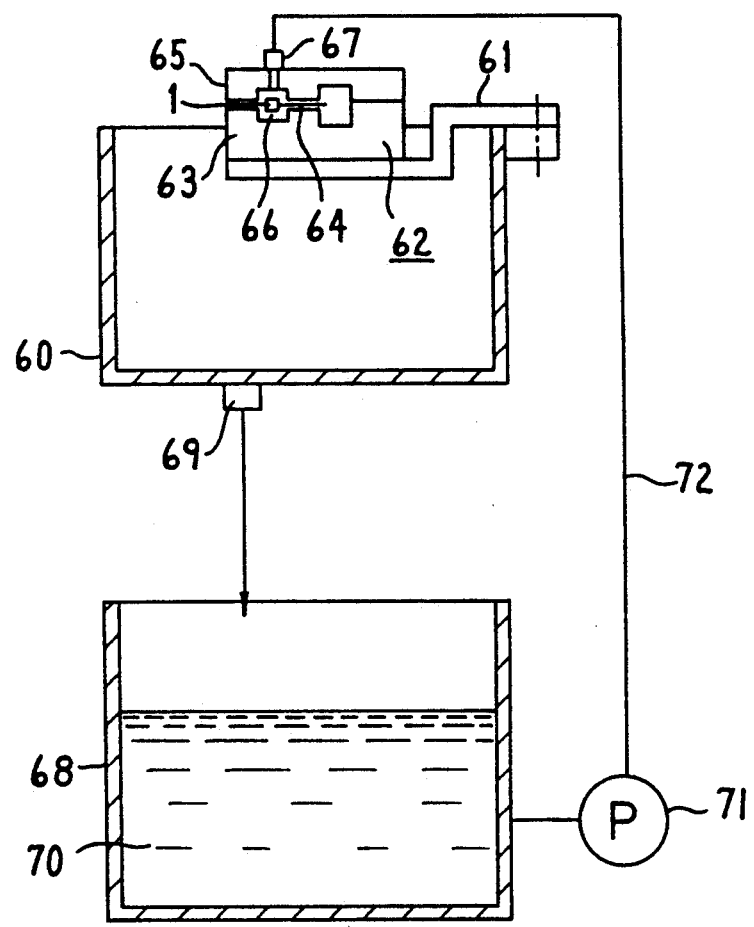
FIG. 7 is a sectional view of another example of a flux coating device.

Another example of embodiment of a flux coating device C shall now be described with reference to FIG. 7. A flux coating block 62 is mounted above the upper end of a first coating bath 60 by a bracket 61. The flux coating block 62 comprises a lower block 63 and an upper block 65, and a hinge connecting the above-mentioned two blocks. The upper block can be opened or closed by the hinge. A slit-like passage 64 for the lead frame is formed between the two blocks, and a passage 66 is provided for the package 2. A pipe 67 is attached to the block and opens into the upper side of the package passage 66. The first flux bath 60 is disposed above a second flux bath, and the two are connected by a drain pipe 69. Flux material 70 in the second flux bath 68 is pumped out by pump 71 and sent to the pipe 67, for discharge into the passages 64 and 66. The passage 64 is filled with the flux material. The lead frame 1 passing through the passage 64 is coated with the flux.

Figure 8:
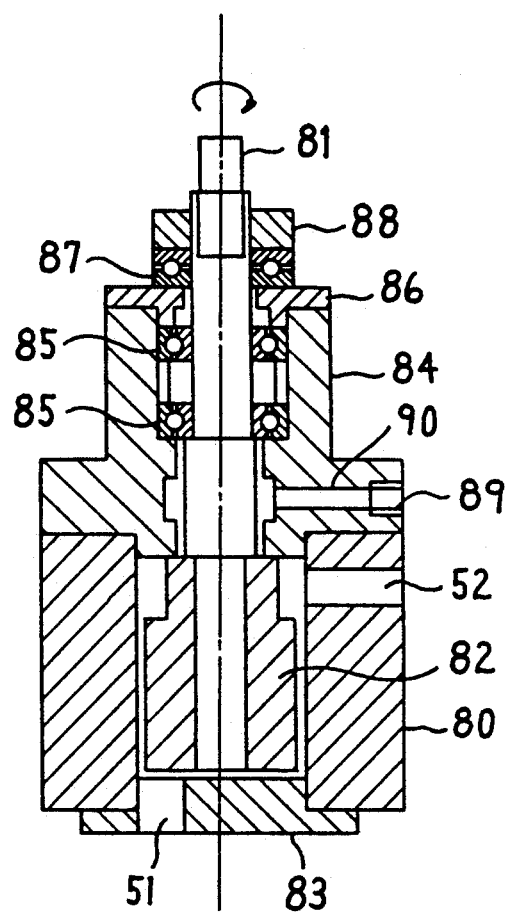
FIG. 8 is a sectional drawing of the pump as used in the solder coating device of FIG. 7.

Next, another example of a solder coating device using a different pump shall be explained by reference to FIG. 8. The pump is a screw pump. The screw 82 is contained inside a housing 80 and connected with a shaft 81. The bottom of the housing is closed by a cover 83 which has a suction inlet 51. The upper part of the housing 80 has an outlet 52. The outlet 52 is connected with the supply pipe 46 of the coating block 35. The upper cover 84 of the housing 80 has a bearing and is closed tightly. The bearing has in its inner side two radial bearings 85 fixed in position by a spacer 86. A thrust bearing 87 is provided on the bearing fixer, and fixed to the shaft 81 by a nut 88 mating with the shaft by a thread. The shaft 81 is coupled with the motor 49 by the coupling 50.

A small hole 90 pierces the lower part of the bearing cover 84 and nitrogen gas can be supplied into said small hole. By supplying gas, pressure is charged around the shaft 81 to prevent liquid solder material from leaking into the radial bearing 85 and also preventing air from invading into the screw section 82.

A stepless speed changer shall be attached on the driving motor 48 to control the number of motor revolutions. By this, the delivered amount of solder material can be adjusted to a suitable state.

Hence, with the present invention, liquid solder material is supplied to the solder supply slit in the solder coating block constantly at determined pressure and in determined quantity without exposure of solder material to atmosphere, thus preventing oxidization of said solder material. Surplus solder material remaining on the coating block, after the coating action is over, returns to the liquid solder bath. Thus the liquid solder material washes away unusable materials such as oxides or debris. This cleaning serves to prevent growth of pinholes and defects in the solder film. Thus, high quality solder coating can be performed.

More specifically, the pump supplies pressurized liquid solder from the solder bath to the intermediate reservoir 44, and from there the liquid solder is forcibly fed through slits 41 into the slit-like lead frame passage 38 on opposite sides of the package passage 39–40. Since these slits 41 extend longitudinally of the passage 38 over most of the length of the passage as it extends through the coating block, and due to the pressurization of the liquid solder supplied to the passage from the pump, the passage 38 is effectively filled with solder so as to create a desirable coating on both of the upper and lower surfaces of the lead sections as the lead frame moves longitudinally through the coating block passage. By suitably adjusting the pump speed in relationship to the size of the passage 38 and rate of movement of lead frames therethrough, a substantially constant quantity of liquid solder can be supplied to and maintained in the passage 38 to effect efficient coating of the lead sections without resulting in an excessive surplus of liquid solder being supplied to the passage 38. However, some surplus of liquid solder will naturally be supplied to the passage 38 to ensure proper coating, which surplus will flow outwardly through the edges of the passage and effect washing or cleaning away of adhered metal oxides or gross around the cleaning block. Any such surplus can be suitably collected and handled as appropriate, such as by being resupplied to the bath.

In this invention, in contrast to other conventional immersion process or roller coating processes, no mechanical moving sections are required except the mechanical transfer device which is necessary to move the lead frame longitudinally through the apparatus. Accordingly, the machine has a simple structure and the possibility of encountering mechanical trouble is greatly reduced.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. In a solder coating apparatus for coating lead sections of a lead frame having packages mounted thereon, said apparatus including a liquid solder bath and a coating block having a first slit-like passage therethrough for permitting a lead frame to pass through said block and a second passage of enlarged cross section communicating with and extending along said first passage for permitting the lead frame package to pass through the block, the improvement comprising a pair of liquid solder supply slits formed in said block and communicating with said first passage along the length thereof and on opposite sides of the second passage, pump means at least partially immersed in the liquid solder bath for positive supply of liquid solder to and through said slits into said first passage, and connecting conduit means connected between the delivery side of the pump and the liquid solder supply slits.

2. An apparatus according to claim 1, wherein the block defines therein an interior reservoir of liquid solder material communicating with lower ends of said solder supply slits, and said connecting conduit means being connected to said interior reservoir.

3. An apparatus according to claim 1, wherein said first and second passages extend horizontally through said block.

4. An apparatus according to claim 3, wherein said second passage communicates with said first passage substantially along the horizontal longitudinal centerline of said first passage, and said first passage including vertically thin slit-like passage portions which project horizontally outwardly from opposite sides of said second passage, said passage portions accommodating said lead sections therein, and said solder supply slits each communicating directly with one of said passage portions.

* * * * *